United States Patent [19]

Werner

[11] Patent Number: 4,783,765

[45] Date of Patent: Nov. 8, 1988

[54] BIPOLAR MEMORY CELL WITH CROSS-CONNECTED TRANSISTORS AND AN EXTERNAL CAPACITANCE

[75] Inventor: Wolfgang Werner, Munich, Fed. Rep. of Germany

[73] Assignee: Siemens Aktiengesellschaft, Berlin and Munich, Fed. Rep. of Germany

[21] Appl. No.: 898,695

[22] Filed: Aug. 21, 1986

[30] Foreign Application Priority Data

Aug. 21, 1985 [DE] Fed. Rep. of Germany ....... 3529898

[51] Int. Cl.⁴ ............................................. G11C 7/00
[52] U.S. Cl. .................................... 365/154; 365/155; 365/179; 365/189
[58] Field of Search ............................... 365/154–156, 365/179, 189

[56] References Cited

U.S. PATENT DOCUMENTS 4,355,374 10/1982 Sakai et al. ......................... 365/149

FOREIGN PATENT DOCUMENTS 2129166 12/1971 Fed. Rep. of Germany .
3023851 1/1981 Fed. Rep. of Germany .

OTHER PUBLICATIONS

Electronic Engineering, vol. 55, No. 675, Mar. 1983, p. 10 London GB; "Linear Silicon Gate CMOS-The II Way".

IEEE-ISSCC, pp. 108–109, Feb. 15, 1979, (Inadachi et al.) "A 6ns 4Kb Bipolar RAM Using Switched Load Resistor Memeory Cell".

Primary Examiner—Stuart N. Hecker
Assistant Examiner—Alyssa H. Bowler
Attorney, Agent, or Firm—Herbert L. Lerner; Laurence A. Greenberg

[57] ABSTRACT

An integrated bipolar memory cell with random access, includes an upper word line, a lower word line, two bit lines, two transistors each having two emitters, a base and a collector fed back crosswise to the base of the other transistor, two Schottky diodes, two low-resistance load resistors each forming a series circuit with a respective one of the Schottky diodes, two high-resistance load resistors each forming a parallel circuit with a respective one of the series circuits, each of the parallel circuits being connected between a respective one of the collectors and the upper word line defining active regions of the memory cell, one of the emitters of each of the transistors being connected to the lower word line, the other of the emitters of each of the transistors being connected to a respective one of the bit lines, and an external capacitance connected between the collectors outside the active regions.

20 Claims, 1 Drawing Sheet

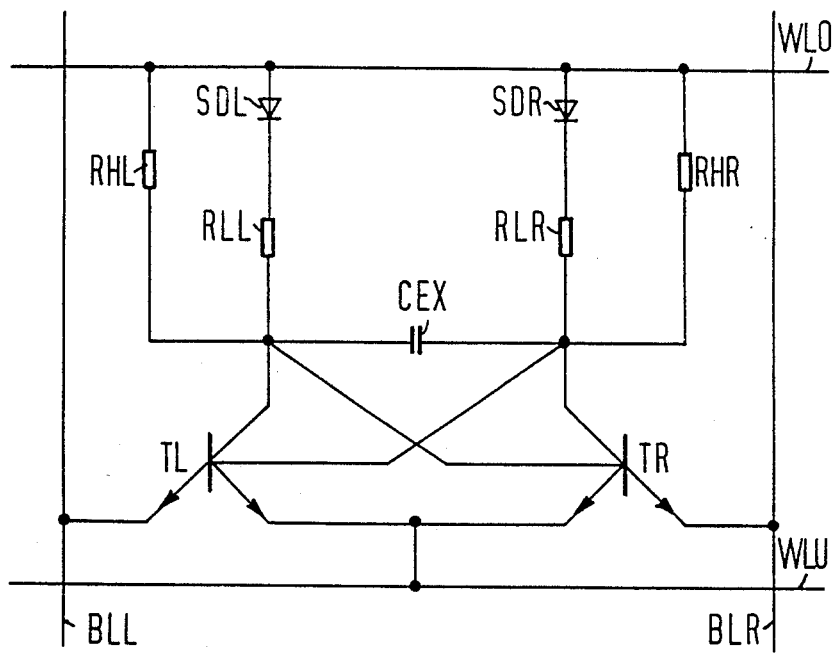

BIPOLAR MEMORY CELL WITH CROSS-CONNECTED TRANSISTORS AND AN EXTERNAL CAPACITANCE

BACKGROUND OF THE INVENTION

Field of the Invention

The invention relates to a bipolar memory cell with random access, comprising an upper word line, a lower word line, two bit lines, two transistors each having two emitters, a base and a collector fed back crosswise to the base, two Schottky diodes, two low-resistance load resistors each forming a series circuit with a respective one of the Schottky diodes, two high-resistance load resistors each forming a parallel circuit with a respective of of the series circuits, each of the parallel circuits being connected between a respective one of the collectors and the upper word line, one of the emitters of each of the transistors being connected to the lower word line, and the other of the emitters of each of the transistors being connected to a respective one of the bit lines.

Such a memory cell for a static bipolar memory with random access is known from a paper by Masaaki Inadachi et al entitled: A 6 ns 4 Kb Bipolar RAM Using Switched Load Resistor Memory Cell, IEEE-ISSCC 1979, page 108 et seq. The principle behind such a memory cell is that one of the two-emitter transistors is always conducting and the other is always cut off. To this end, the collectors of the transistors are fed back crosswise to the bases and connected through the respective parallel circuit of a high-resistance load resistor and a Schottky diode in series with a low-resistance load resistor to an upper word line, while one emitter of each transistor is tied to a common lower word line and the other emitter of each transistor is connected to a bit line.

A bipolar memory contains a multiplicity of such memory cells disposed in the form of a matrix. The row selection is accomplished through the upper word line, the potential of which is raised or lowered. The potential of the lower word line follows the upper word line. The column selection is accomplished by the two bit lines and the determination as to which of the transistors conducts and which does not.

In stand-by operation, the high-resistance load resistor of the conducting transistor is effective since the upper word line and the bit lines are not selected. If a cell is selected, on one hand the upper word line is raised with respect to its potential and on the other hand the bit lines are connected to a current source. In this way, a current flows through the Schottky diodes and the low-resistance load resistor, so that the resulting total load resistance of the conducting transistor assumes a low resistance. When selecting the memory cell, the current is about 2 to 3 orders of magnitude larger than the standby current.

When information is stored, the process is reversed, so that one transistor is switched into the conducting state quickly and the other is switched into the cut-off state relatively slowly. The low-resistance load resistor in connection with the storage capacitance, provides the required storage excursion of about 400 to 500 mV.

In bipolar memories according to the state of the art, the capacitances which serve in principle for the storage of electric charges for the information storage in a semiconductor memory, are formed by the base-collector and the Schottky diode capacitance, the value of which is about 400 fF. This relatively large capacitance requires large specific capacitances and large areas for the Schottky diode and the base of the transistors. It is a disadvantage in such a case that the capacitance of the pn junction depends on the voltage and that the active area of the components is larger than is required due to design rules and emitter areas, which results in a large collector-substrate capacity. Furthermore, a large specific base-collector capacitance increases the typical time constants which have a detrimental effect in logic applications.

On the other hand. the collector-substrate capacitance of a bipolar memory cell should be as small as possible for reasons of interferrence suppression, since in rewriting, the collector-substrate capacitance must reverse the charge polarity and thus counteract the charging of the storage capacitance. According to experience, the ratio of the effective storage capacitance to the parasitic collector-substrate capacitance is to be larger than 5.

It is accordingly an object of the invention to provide a bipolar memory cell with an external capacitance, which overcomes the hereinfore-mentioned disadvantages of the heretoforeknown devices of this general type, to improve the speed of the logic and interference suppression of a bipolar storage cell and to offer the possibility of optimizing and constructing the cell components separately.

SUMMARY OF THE INVENTION

With the foregoing and other objects in view there is provided, in accordance with the invention, an integrated bipolar memory cell with random access, comprising an upper word line, a lower word line, two bit lines, two transistors each having two emitters, a base and a collector feed back crosswise to the base of the other transistor, two Schottky diodes, two low-resistance load resistors each forming a series circuit with a respective one of the Schottky diodes, two high-resistance load resistors each forming a parallel circuit with a respective one of the series circuits, each of the parallel circuits being connected between a respective one of the collectors and the upper word line defining active regions of the memory cell, one of the emitters of each of the transistors being connected to the lower word line, the other of the emitters of each of the transistors being connected to a respective one of the bit lines, and an external capacitance connected between the collectors outside the active regions.

In accordance with another feature of the invention, the external capacitance is larger than parasitic substrate capacitances.

In accordance with a further feature of the invention, the external capacitance is formed of two highly doped polysilicon layers with a dielectric of silicon oxide or silicon nitride or a double layer of silicon oxide and silicon nitride or a triple layer of silicon oxide, silicon nitride and silicon oxide.

In accordance with an added feature of the invention. the dielectric is less than 30 nm thick.

In accordance with an additional feature of the invention, the external capacity is a stacked capacitor.

In accordance with again another feature of the invention, the external capacitance is disposed on or between the active regions.

In accordance with again a further feature of the invention, the external capacitance is applied to an insulating oxide.

In accordance with again an added feature of the invention, the insulating oxide is more than 1 μm thick.

In accordance with again an additional feature of the invention, the external capacity is a trench capacity.

In accordance with yet another feature of the invention, the high-resistance load resistors or low-resistance load resistors or high-resistance and/or low-resistance load resistors are disposed outside the active regions.

In accordance with a concomitant feature of the invention, the transistor, Schottky diode, low-resistance load resistor and high-resistance load resistor connected to a respective bit line through a respective one of the other emitters, are disposed geometrically in two groups, between which the external capacitance is disposed.

Other features which are considered as characteristic for the invention are set forth in the appended claims.

Although the invention is illustrated and described herein as embodied in a bipolar memory cell with an external capacitance it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single figure of the drawing is a schematic circuit diagram of the device according to the invention.

DESCRIPTION OF THE PREFERRED EMBODIMENTS

Referring now to the figure of the drawing in detail, there is seen a left bit line BLL and a right bit line BLR. A transistor TL with a high-resistance collector resistor RHL which is parallel to a series circuit of a Schottky diode SDL and a low-resistance resistor RLL, belong to the right bit line BLL. Corresponding elements TR, RHR. SDR and RLR belongs to the right bit line BLR. A common junction point between the Schottky diodes SDL and SDR as well as the resistors RHL and RHR is connected to an upper word line WLD and the first emitter of each of the transistors TL and TR is connected to a lower word line WLU. The second emitter of the transistor TL is connected to the bit line BLL and the second emitter of the transistor TR is connected to the bit line BLR. The collector of the transistor TL is fed back to the base of the transistor TR and the collector of the transistor TR is fed back to the base of the transistor TL.

According to the invention, a capacitance which is substantially used for the required storage capacity. is located outside the active region of the transistors which is connected between the collector and base terminals of the two transistors.

According to the invention, an external capacitance CEX can be provided in different ways, for instance, as a stacked capacitor or as a trench capacitor. In the embodiment using a stacked capacitor, the capacitor CEX is formed of two highly doped polysilicon layers with an interposed dielectric of silicon dioxide or silicon nitride, the thickness of which is less than 30 nm, and preferably 10 to 20 nm. The dielectric can also be a double or triple layer of silicon oxide and silicon nitride or silicon oxide, silicon nitride and silicon oxide. The stacked capacitor can be disposed above the active components as well as between the active components. An external capacitance located between the active components can be applied to an insulating oxide, the thickness of which is more than 1 μm, and preferably about 1.3 μm.

It is within the scope of the invention to separately optimize the remaining components of the bipolar storage cell with respect to their properties. Thus, for instance, the transistor area can be decreased, which results in a smaller collector-substrate capacitance and in reduced sensitivity to alpha particles. The transistor can be optimized in this case independently of the collector-base capacitance and the Schottky diode capacitance as well as independently of the high-resistance and low-resistance load resistors. According to the invention, the high-resistance and low-resistance load resistors are therefore also constructed and optimized in such a way that their parasitic capacitances become negligibly small.

Overall, the ratio of the effective storage capacitance as the sum of the external capacitance CEX the collector-base capacitance and the Schottky diode capacitance to the collector-substrate capacitance, can be varied over wide ranges. It is possible to achieve an optimum interference suppression and speed from this ratio. At the same time, a higher yield and less sensitivity to alpha particles become possible.

According to the invention, it is furthermore possible to construct the high-resistance and/or low-resistance load resistors as external resistors. By making use of this measure, the cell area can be further reduced since, for instance, the high-resistance resistor according to the state of the art is an ion-implanted resistor and the low-resistance resistor is a buried-layer resistor.

The use of a smaller area for the bipolar storage cell permits a higher packing density for the same chip size or a larger distance between the individual resistors. Since the transistors customarily have buried-layer zones disposed in the semiconductor substrate and are mutually separated by channel stoppers, smaller collector-substrate capacitances result from larger distances between the transistors in the direction toward increasing the interference suppression.

A topologically advantageous structure is also obtained if the elements assigned to a respective bit line are geometrically disposed in two groups, namely the elements TL, SDL, RHL and RLL on one other hand, and the elements TR, SDR, RHR and RLR on the other hand, between which the external capacitance CEX is disposed.

The foregoing is a description corresponding in substance to German application No. P 35 29 898.7, dated Aug. 21, 1985, the International priority of which is being claimed for the instant application, and which is hereby made part of this application. Any material discrepancies between the foregoing specification and the aforementioned corresponding German application are to be resolved in favor of the latter.

I claim:

1. Integrated bipolar memory cell with random access, comprising an upper word line, a lower word line, two bit lines, two transistors each having two emitters, a base and a collector fed back crosswise to said base of the other transistor, two Schottky diodes, two low-resistance load resistors each forming a series circuit with a respective one of said Schottky diodes, two high-resistance load resistors each forming a parallel circuit with a respective one of said series circuits, each of said parallel circuits being connected between a respective one of said collectors and said upper word line defining active regions of the memory cell, one of said emitters of each of said transistors being connected to said lower word line, the other of said emitters of each of said transistors being connected to a respective one of said bit lines, and an external capacitance connected between said collectors outside said active regions.

2. Bipolar memory cell according to claim 1, wherein said external capacitance is larger than parasitic substrate capacitances.

3. Bipolar memory cell according to claim 1, wherein said external capacitance is formed of two highly doped polysilicon layers with a dielectric of silicon oxide.

4. Bipolar memory cell according to claim 1, wherein said external capacitance is formed of two highly doped polysilicon layers with a dielectric of silicon nitride.

5. Bipolar memory cell according to claim 1. wherein said external capacitance is formed of two highly doped polysilicon layers with a dielectric of a double layer of silicon oxide and silicon nitride.

6. Bipolar memory cell according to claim 1, wherein said external capacitance is formed of two highly doped polysilicon layers with a dielectric of a triple layer of silicon oxide, silicon nitride and silicon oxide.

7. Bipolar memory cell according to claim 3, wherein said dielectric is less than 30 nm thick.

8. Bipolar memory cell according to claim 4, wherein said dielectric is less than 30 nm thick.

9. Bipolar memory cell according to claim 5, wherein said dielectric is less than 30 nm thick.

10. Bipolar memory cell according to claim 6, wherein said dielectric is less than 30 nm thick.

11. Bipolar memory cell according to claim 1, wherein said external capacitance is a stacked capacitor.

12. Bipolar memory cell according to claim 1, wherein said external capacitance is disposed on said active regions.

13. Bipolar memory cell according to claim 1, wherein said external capacitance is disposed between said active regions.

14. Bipolar memory cell according to claim 1, wherein said external capacitance is applied to an insulating oxide.

15. Bipolar memory cell according to claim 14, wherein said insulating oxide is more than 1 $\mu$m thick.

16. Bipolar memory cell according to claim 1, wherein said external capacitance is a trench capacity.

17. Bipolar memory cell according to claim 1, wherein said high-resistance load resistors are disposed outside said active regions.

18. Bipolar memory cell according to claim 1, wherein said low-resistance load resistors are disposed outside said active regions.

19. Bipolar memory cell according to claim 1, wherein said high-resistance and low-resistance load resistors are disposed outside said active regions.

20. Bipolar memory cell according to claim 1, wherein said transistors, Schottky diode, low-resistance load resistor and high-resistance load resistor connected to a respective bit line through a respective one of said other emitters, are disposed geometrically in two groups, between which said external capacitance is disposed.

* * * * *